(12) United States Patent  
Ogata

(10) Patent No.: US 7,656,044 B2  
(45) Date of Patent: *Feb. 2, 2010

(54) SEMICONDUCTOR DEVICE WITH IMPROVED RESIN CONFIGURATION

(75) Inventor: Yoshiharu Ogata, Sakata (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/174,273

(22) Filed: Jul. 16, 2008

(65) Prior Publication Data

US 2008/0277803 A1 Nov. 13, 2008

Related U.S. Application Data

(62) Division of application No. 11/176,782, filed on Jul. 7, 2005, now Pat. No. 7,476,975.

(30) Foreign Application Priority Data

Aug. 23, 2004 (JP) ............................. 2004-242330

(51) Int. Cl.
*H01L 23/52* (2006.01)
(52) U.S. Cl. ........................ 257/778; 257/783; 257/790; 257/E23.127; 257/E23.134
(58) Field of Classification Search .................. 257/687, 257/728, 729, 777, 778, 783, 790, 791, E23.127, 257/E23.129, E23.132–E23.134
See application file for complete search history.

(56) References Cited

U.S. PATENT DOCUMENTS 5,959,363 A 9/1999 Yamada et al.

| 6,335,571 | B1 | 1/2002 | Capote et al. |
| 6,448,665 | B1 | 9/2002 | Nakazawa et al. |
| 6,885,522 | B1 | 4/2005 | Kira et al. |

(Continued)

FOREIGN PATENT DOCUMENTS

JP 10-233463 9/1998

(Continued)

OTHER PUBLICATIONS

Communication from Japan Patent Office regarding counterpart application.

*Primary Examiner*—Matthew E Warren
(74) *Attorney, Agent, or Firm*—Harness, Dickey & Pierce, P.L.C.

(57) ABSTRACT

A semiconductor device comprises a wiring substrate including a wiring pattern; a semiconductor chip installed on the wiring substrate, including a plurality of pads formed on a surface of the semiconductor chip, which opposes the wiring substrate; a first resin layer covering over a part of the wiring pattern within a region of overlapping the semiconductor chip; and a second resin layer installed between the semiconductor chip and the first resin layer. The pads are oppose to and coupled with a part of the wiring pattern exposed over the first resin layer; and the linear expansion coefficient of the wiring substrate is larger than that of the semiconductor chip, the elastic modulus of the wiring substrate is lower than that of the semiconductor chip and the linear expansion coefficient of the first resin layer is larger than that of the second resin layer. The elastic modulus of the first resin layer is lower than that of the second resin layer.

14 Claims, 3 Drawing Sheets

U.S. PATENT DOCUMENTS

| | | | |
|---|---|---|---|
| 7,476,975 B2 * | 1/2009 | Ogata | 257/778 |
| 2001/0002727 A1 | 6/2001 | Shiraishi et al. | |

FOREIGN PATENT DOCUMENTS

| | | |
|---|---|---|
| JP | 11-135551 | 5/1999 |
| JP | 2000-208903 | 7/2000 |
| JP | 2000-236042 A | 8/2000 |
| JP | 2004-079721 | 3/2004 |

* cited by examiner

SEMICONDUCTOR DEVICE WITH IMPROVED RESIN CONFIGURATION

CROSS-REFERENCE TO RELATED APPLICATIONS

This application is a divisional application of U.S. Ser. No. 11/176,782 filed Jul. 7, 2005, claiming priority to Japanese Patent Application No. 2004-242330 filed Aug. 23, 2004 all of which are hereby incorporated by reference.

BACKGROUND OF THE INVENTION

1. Technical Field

The present invention relates a semiconductor device.

2. Related Art

It is well known that a wiring substrate is firmly fixed with a semiconductor chip via a resin layer. In such case, removing a wiring substrate from semiconductor chip is prevented by a resin layer so as to improve reliability of a semiconductor device.

Japanese Unexamined Patent Publication No. 10-233463 is an example of related art.

SUMMARY

An advantage of the invention is to provide highly reliable semiconductor device.

According to an first aspect of the invention, a semiconductor device of the present invention comprises: a wiring substrate including a wiring pattern; a semiconductor chip installed on the wiring substrate, including a plurality of pads on the surface of the semiconductor chip, which opposes the wiring substrate; a first resin layer covering over a part of the wiring pattern within a region of overlapping with the semiconductor chip; and a second resin layer installed between the semiconductor chip and the first resin layer. Further, the pads are oppose to and coupled with a part of the wiring pattern exposed over the first resin layer; and the linear expansion coefficient of the wiring substrate is larger than that of the semiconductor chip, the elastic modulus of the wiring substrate is lower than that of the semiconductor chip and the linear expansion coefficient of the first resin layer is larger than that of the second resin layer, the elastic modulus of the first resin layer is lower than that of the second resin layer. The invention shows that two resin layers, of which the linear expansion coefficient and the elastic modulus are different each other, are installed between the wiring substrate and the semiconductor chip. Hence, these layers prevent the wiring substrate from removing from the semiconductor chip, providing a highly reliable semiconductor chip.

In the semiconductor device of the invention, the adhesiveness of a part of the wiring pattern covered by the first resin layer with resin may be higher than that of the exposed part of the wiring pattern. This adhesiveness prevents the first resin layer for removing from the wiring substrate. Hence, a further highly reliable semiconductor device can be provided.

In the semiconductor device of the invention may include a third resin layer installed on the other surface opposing one surface of the wiring substrate in which the semiconductor substrate is installed.

In the semiconductor device, the material of third resin layer may be the same of the first resin layer.

BRIEF DESCRIPTION OF THE DRAWINGS

The invention will be described with reference to the accompanying drawings, wherein like numbers refer to like elements, and wherein.

DESCRIPTION OF THE EMBODIMENTS

Figure 1:
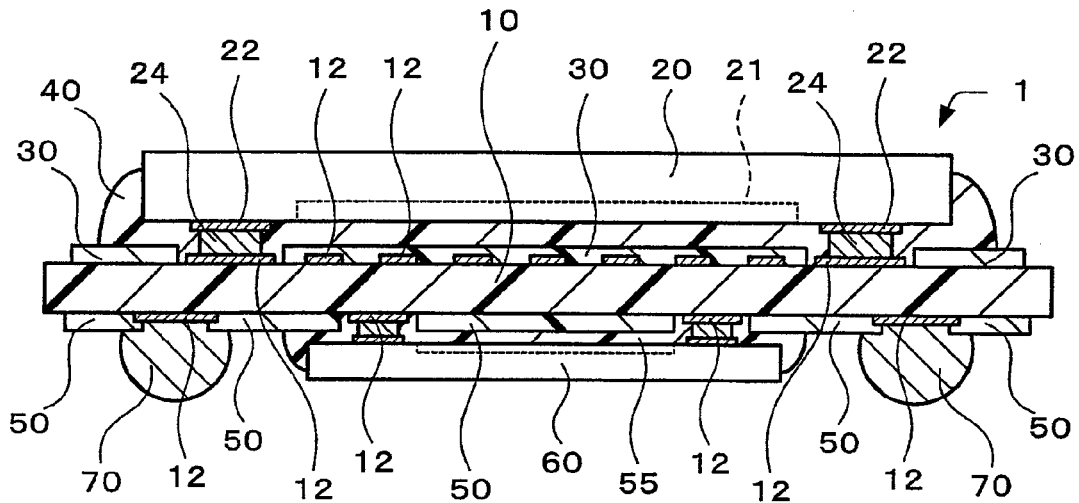
FIG. 1 shows a semiconductor device of a first embodiment of the invention.

Embodiments of the invention will now be described with reference to the accompanying drawings. But the essence of the present invention is not limited to the following embodiment. FIG. 1 shows a semiconductor device of a first embodiment of the invention. FIG. 1 is a cross sectional view of a semiconductor device.

A semiconductor device of the present invention includes a wiring substrate 10 as shown in FIG. 1. A material and structure of the wiring substrate 10 is not specifically limited and may be any of well-known substrates. The wiring substrate 10 may be a flexible or rigid. Otherwise, the wiring substrate 10 may be a tape. the wiring substrate 10 may also a stacked multi layered type or a single layer. Further, the configuration of the wiring substrate 10 is not specifically limited. In a semiconductor device of the present embodiment, the linear expansion coefficient of the wiring substrate 10 is larger than that of a semiconductor chip 20 described later. The elastic modulus of the wiring substrate 10 is lower than that of the semiconductor chip 20. The wiring substrate 10 includes a wiring pattern 12 as shown in FIG. 1. The wiring pattern 12 may be installed on one surface of the wiring substrate 10. Otherwise, two of the wiring patterns 12 may be installed on both surfaces of the wiring substrate 10 as shown in FIG. 1. In this case, each of the wiring patterns 12 installed on both surfaces of the wiring substrate 10 may be connected to other. When the wiring substrate 10 is multiple layers, the wiring patterns 12 may be installed between multiple layers of the wiring substrate 10 (not shown). A material and structure of the wiring pattern12 is not specifically limited. The wiring pattern12 may be a single layered conductive pattern. Otherwise, the wiring pattern12 may be a multiple layered conductive pattern. In this case, the wiring pattern 12 may include a layer made of cupper.

A semiconductor device of the embodiment includes the semiconductor chip 20 having a plurality of pads 22 as shown in FIG. 1. The semiconductor chip 20 may include a integrated circuit 21 as shown in FIG. 1. A structure of the integrated circuit 21 is not specifically limited, but may include active elements such as transistors and passive elements such as resisters, capacitors and coils. Pads 22 may be electrically connected to the integrated circuit 21. Otherwise, the pads 22 may further include pads, which electrically connected to the integrated circuit 21. The pads 22 may be installed only at the end of the semiconductor chip 20. The pads 22 may be arranged along four sides of the semiconductor chip 20 or two sides of it. Otherwise, the pads 22 may be arranged like an area array. A material and structure of the pad 22 is not specifically limited. The pad 22 may be a thin and plane film made of copper, aluminum or gold for example. The semiconductor chip 20 is installed on the substrate 10 so that the surface including the pads 22 opposes the wiring substrate 10. The pads 22 are opposed to and electrically connected to the wiring pattern 12. In detail, the pads 22 are opposed to and electrically connected to a part of the wiring pattern 12 exposed from a first resin layer 30 described later. The wiring pattern 12 may be electrically connected to the pads 22 via a conductive member 24 shown as FIG. 1. The linear expansion coefficient of the semiconductor chip 20 is small than that of the wiring substrate 10. The elastic modulus of the semiconductor chip 20 is higher than that of the wiring substrate 10. In other word, the linear expansion coefficient of the wiring substrate 10 is larger than that of the semiconductor chip 20. The elastic modulus of the wiring substrate 10 is lower than that of the semiconductor chip 20.

Figure 2A:
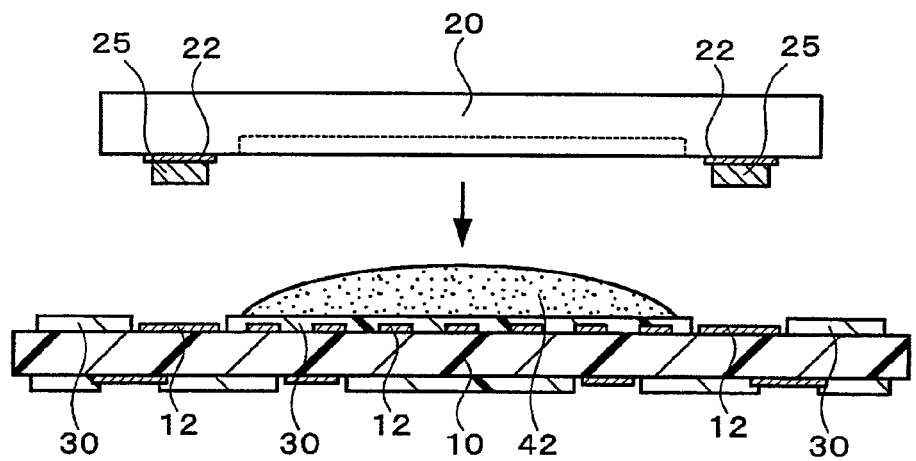
FIGS. 2A and 2B show a method of manufacturing a semiconductor device of the embodiment of the invention.
Figure 2B:
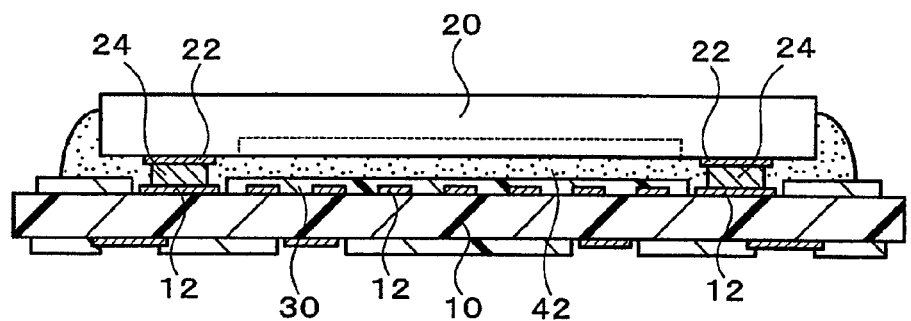

A semiconductor device of the embodiment includes a first and second resin layers 30 and 40 as shown in FIG. 1. The linear expansion coefficient of the first resin layer 30 is larger than that of the second resin layer 40. The elastic modulus of the first resin layer 30 is lower than that of the second resin layer 40. The first resin layer 30 covers over a part of the wiring pattern 12 within a region overlapping the semiconductor chip 20. In such case, the first resin layer 30 may be installed on the wiring substrate 10. Namely, the first resin layer 30 may partially contact with the surface of the wiring substrate 10. The first resin layer 30 may be formed so as to avoid a part in which the wiring pattern 12 is electrically connected with the pads 22 of the semiconductor chip 20. The first resin layer 30 may be formed so as to reach the outside of a region of the wiring substrate 10 on which the semiconductor chip 20 is installed. Otherwise, the first resin layer 30 may be formed only within a region overlapping a region of the wiring substrate 10 in which the pads 22 are formed for the semiconductor chip 20 (not shown). The plane configuration of the first resin layer 30 is not specifically limited. The first resin layer 30 may be arranged along the wiring pattern 12 so as to cover the wiring pattern 12 for example. Otherwise, the plane configuration of the first resin layer 30 may be extended toward the direction of a diagonal line of a region in which the semiconductor chip 20 is installed on the wiring substrate 10. A method of forming the first resin layer 30 is not specifically limited. A resin layer may be formed covering all over the wiring pattern 12 and partially removed so as to form the configuration of the first resin layer 30 as initially designed. In a semiconductor device of the embodiment, the second resin layer 40 is formed between the semiconductor chip 20 and the first resin layer 30. The second resin layer 40 may be formed within a region in which the first resin layer 30 is formed shown as FIG. 1. Otherwise, the second resin layer 40 may be formed reaching the outside of the first resin layer 30 (not shown). The second resin layer 40 may be formed reaching the outside of the semiconductor chip 20 shown as FIG. 1. The second resin layer 40 may be formed covering over a part of the wiring substrate lo exposed from the first resin layer 30. In this case, the second resin layer 40 may be formed contacting a part of the wiring substrate10 exposed from the first resin layer 30. The second resin layer 40 may be formed covering over a part of the wiring pattern 12 exposed from the first resin layer 30. A method of forming the second resin layer 40 is not specifically limited. A resin material 42 is formed on the first resin layer 30 and the wiring substrate 10 (shown in FIG. 2A). The resin material 42 may be a paste or a sheet. Then, the semiconductor chip 20 is installed on the wiring substrate 10 shown as FIG. 2A. In this case, the pads 22 of the semiconductor chip 20 may include a bump 25 as shown in FIG. 1A. Then, the semiconductor chip 20 is installed with pressing and expanding the resin material 42 as shown in FIG. 2B. The resin material 42 is cured after electrically connecting the wiring pattern 12 to the pads 22. Thus, the wiring pattern 12 is electrically connected to the pads 22 and the semiconductor chip 20 is firmly fixed to the wiring substrate 10. Electrical connecting the wiring pattern 12 to the pads 22 may be implemented more than soldering. Alloyed junction of the wiring pattern 12 with the bump 25 may be implemented so as to form the conductive member 24 shown as FIG. 2B. Otherwise, conductive fine particles are introduced between the wiring pattern 12 and the bump 25 so as to electrically connect the wiring pattern 12 with the pads 22 (not shown).

As described above, in a semiconductor device of the embodiment, the first and the second resin layers 30 and 40 are formed between the wiring substrate 10 and the semiconductor chip 20. In other word, the wiring substrate 10 and the semiconductor chip 20 are fixed each other by the first and the second resin layers 30 and 40. As described above, in a semiconductor device of the embodiment, the linear expansion coefficient of the first resin layer 30 is larger than that of the second resin layer 40,and the elastic modulus of the first resin layer 30 is lower than that of the second resin layer 40. Further, the linear expansion coefficient of the wiring substrate 10 is larger than that of the semiconductor chip 20, and the elastic modulus of the wiring substrate 10 is lower than that of the semiconductor chip 20. Therefore, contacting the wiring substrate 10 with the first resin layer 30 makes occurrence of stress difficult at an interface, comparing with the contact of the wiring substrate 10 with the second resin layer 40. Further, contacting the second resin layer 40 with the semiconductor chip 20 also makes occurrence of stress difficult at an interface, comparing with the contact of the semiconductor chip 20 With the first resin layer 30. It is uneasy to remove the first resin layer 30 from the second resin layer 40 since these layers are made of resin. As described above, in a semiconductor device of the embodiment, the first resin layer 30 is formed on the wiring substrate 10(the wiring pattern 12) and the second resin layer 40 is formed between the semiconductor chip 20 and the first resin layer 30. Hence, these layers prevent the wiring substrate 10 from removing from the semiconductor chip 20, providing a highly reliable semiconductor chip.

Here, in a semiconductor device of the embodiment, the adhesiveness of a part of the wiring pattern 12 covered by the first resin layer 30 with resin may be higher than that of the exposed part of the wiring pattern 12 from the first resin layer 30. Thus, this adhesiveness prevents removing the first resin layer 30 from the wiring substrate 10, providing a further highly reliable semiconductor chip. A method of forming parts of the wiring pattern 12 of which adhesiveness is different each other, is mot specifically limited. For example, the wiring pattern 12 is formed with cupper and the surface of it is roughly processed. The first resin layer 30 is formed thereafter, so as to heighten the adhesiveness of the first resin layer 30 with the wiring pattern 12. Further, the exposed part of the wiring pattern 12 from the first resin layer 30 can be an appropriate structure for electrically contact with other conductive member by plating it after forming the first resin layer 30. Namely, the electrical reliability of the pads 22 of the semiconductor chip 20 against the first resin layer 30 can be heightened. Hence, this process prevents the wiring substrate 10 from removing from the semiconductor chip 20, providing a highly-electrically-reliable semiconductor chip.

Here, in a semiconductor device of the embodiment, a third resin layer 50 may be formed as shown in FIG. 1. The third resin layer 50 is formed on the other surface of the wiring substrate 10 of which is opposite to one surface on which the semiconductor chip 20 is installed. Hence, resin layers are formed on the both surfaces of the wiring substrate 10, making difference of stresses applied to the both surfaces small. Therefore, this structure prevents the wiring substrate 10 from warpage, buckle and bend, providing a highly reliable semiconductor device. Here, the third resin layer 50 may be made of the same material of the first resin layer 30. This forming makes making difference of stresses applied to the both surfaces further small providing a further highly reliable semiconductor device. Here, when the wiring pattern 12 is formed on the other surface of the wiring substrate 10 opposing to an surface on which the semiconductor substrate 20 is installed, the third resin layer 50 may be formed covering over a part of the wiring pattern 12.

A semiconductor device of the embodiment may further include a second semiconductor chip 60 as shown in FIG. 1. The second semiconductor chip 60 may be installed on the wiring substrate 10. The second semiconductor chip 60 may be formed on the other surface of the wiring substrate 10 of which is opposite to one surface on which the semiconductor chip 20 is installed. Here, a fourth resin layer 55 may be formed between the third resin layer 50 and the second semiconductor chip 60 as shown in FIG. 1. The linear expansion coefficient of the fourth resin layer 55 is smaller than that of the third resin layer 50, and the elastic modulus of the fourth resin layer 55 is higher than that of the third resin layer 50. This relationship prevents the second semiconductor chip 60 from removing. Here, the material of fourth resin layer 55 may be the same of the second resin layer. Otherwise, a semiconductor device of the embodiment may not include the second semiconductor chip 60 and the fourth resin layer 55.

A semiconductor device of the embodiment may further include an external terminal 70. The external terminal 70 may be formed on the other surface of the wiring substrate 10 of which is opposite to one surface on which the semiconductor chip 20 is installed. The external terminal 70 may be formed, electrically connecting to the wiring pattern 12. The external terminal 70 may be formed with solider for example. Including the external terminal 70 can provide a semiconductor device, which can be easily mounted on a circuit substrate and the like.

Figure 3:
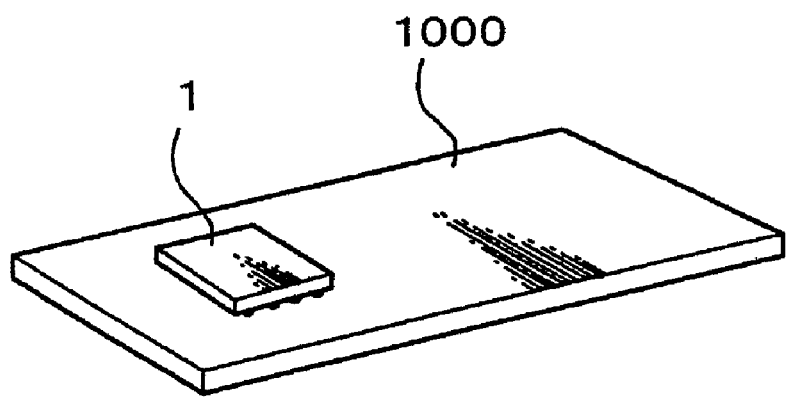
FIG. 3 shows a circuit board in which the semiconductor device of the embodiment of the invention is mounted.
Figure 4:
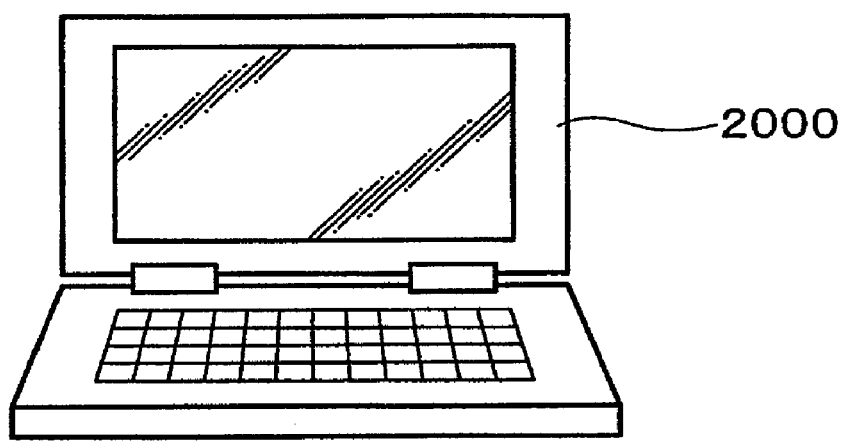
FIG. 4 shows an electronic device in which the semiconductor device of the embodiment of the invention is mounted.
Figure 5:
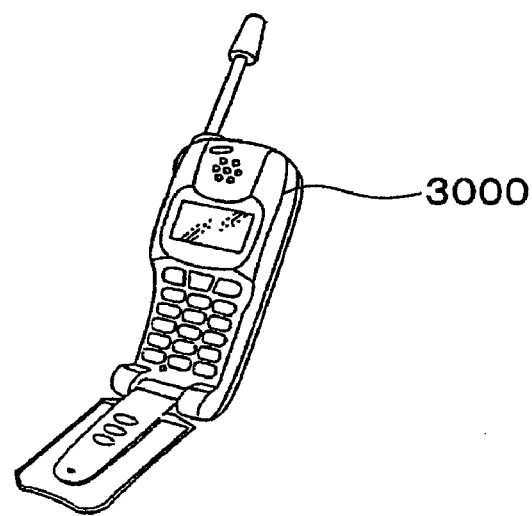
FIG. 5 shows an electronic device in which the semiconductor device of the embodiment of the invention is mounted.

A semiconductor device of the embodiment may have the above-mentioned structure. FIG. 3 shows a circuit board 1000 in which the semiconductor device 1 of the embodiment of the invention is mounted. Further, as an electronic device including a semiconductor device of the embodiment, a not type personal computer 2000 is shown in FIG. 4 and a mobile phone 3000 is also shown in FIG. 5.

Figure 6:
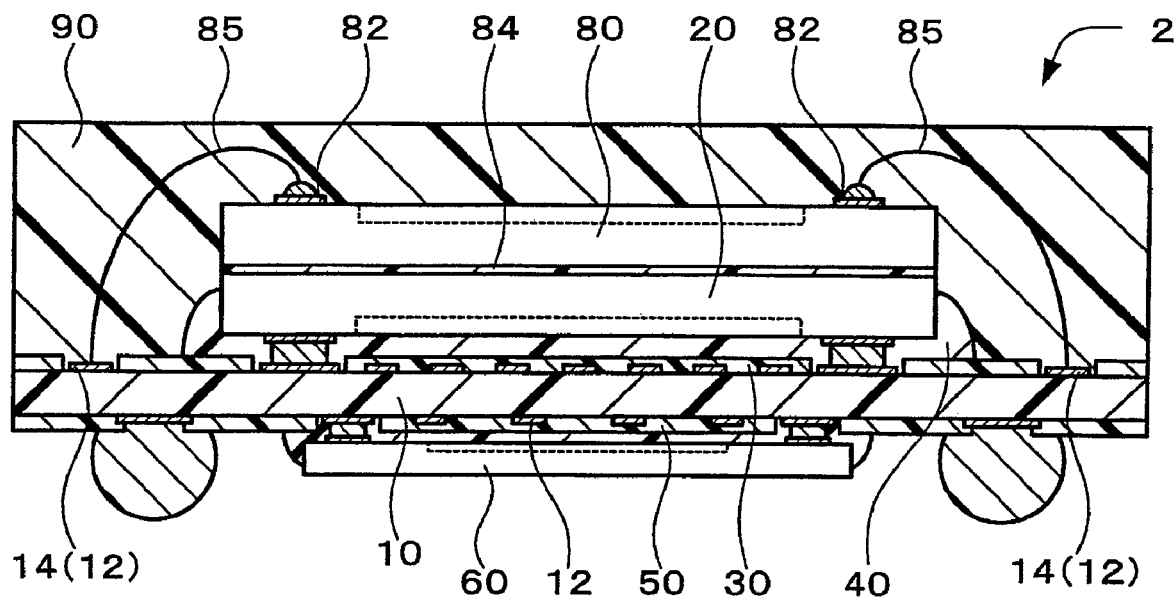
FIG. 6 shows a semiconductor device of a modification of the embodiment of the invention.

(Modification) Modification of the embodiment of a semiconductor device is explained hereafter. In a semiconductor device of the modification, all structures, which were already explained, are also applied as much as they can. FIG. 6 shows a cross section of a semiconductor device 2 of the modification of the embodiment.

A semiconductor device of the modification includes an electrical connecting part 14 in the wiring substrate 10 as shown in FIG. 6. The electrical connecting part 14 may be a part of the wiring pattern 12. The electrical connecting part 14 is installed on the surface of the wiring substrate on which the semiconductor chip 20 is installed. The electrical connecting part 14 is arranged outside of a region, which overlaps the semiconductor chip 20. The electrical connecting part 14 is exposed from the first resin layer 30 as shown in FIG. 6. In other word, in a semiconductor device of the modification, the first resin layer is formed avoiding the electrical connecting part 14.

A semiconductor device of the modification may include a third semiconductor 80 as shown in FIG. 6. The third semiconductor chip 80 may include pads 82. As shown in FIG. 6, the third semiconductor chip 80 may be formed on the semiconductor chip 20 so that other surface of it, which is opposite to a surface on which the pads 82 are installed, opposes the semiconductor chip 20. The third semiconductor chip 80 may be fixed to the semiconductor chip 20 via a insulating layer 84.

A semiconductor device of the modification may include a wirer 85 as shown in FIG. 6. The pads 82 of the third semiconductor chip 80 is electrically connected to the electrical connecting part 14 on the wiring substrate 10 via the wire 85. A method of installing the wire 85 is not specifically limited; any of well-known methods can be applied. Further, a material of the wire 85 is also not specifically limited, and a gold wire can be applied for example.

A semiconductor device of the modification includes a resin part 90 as shown in FIG. 6. The resin part 90 may seal the first and the third semiconductor chips 20 and 80, and the wirier 85. This sealing prevents the wire 85 from corruption and a plurality of wires 85 from contacting each other, providing a highly reliable semiconductor device. A method of forming the resin part 90 is not specifically limited, and any of well-known methods can be applied. Further, a range of forming the resin part 90 and the material of it are not specifically limited.

A semiconductor device of the modification may include a second semiconductor chip 60 as shown in FIG. 6. Otherwise, a semiconductor device of the modification may not include the second semiconductor chip 60 (not shown.)

It should be noted that the present invention is not limited to the above-mentioned embodiments, and various changes and modifications can be made within the spirit and scope of the invention. For example, the present invention includes substantially the same structure (including the structure with the same functions, methods, and results and the structure with the same goals and results) as the structure of the above-mentioned embodiments. The present invention also includes other structures in which non-essential elements of the above-mentioned embodiments are substituted. The present invention also includes the structures that can achieve the same effects or the same goals as those achieved by the above-mentioned embodiments. Moreover, the present invention includes other structures in which known methods and techniques are incorporated into the above-mentioned embodiments.

What is claimed is:

1. A semiconductor device comprising:
   a wiring substrate including a wiring pattern;
   a semiconductor chip having a pad disposed on a first surface thereof and mounted on the wiring substrate so that the first surface of the semiconductor chip opposes the wiring substrate;
   a first resin layer covering a first part of the wiring pattern, overlapping the semiconductor chip, the first resin layer including an opening disposed on a second part of the wiring pattern, the second part of the wiring pattern overlapping the pad;
   a conductive member disposed in the opening of the first resin layer and connecting the pad and the second part of the wiring pattern; and a second resin layer disposed between the semiconductor chip and the first resin layer and at least partially disposed within the opening of the first resin layer and between the first resin layer and the conductive member.

2. A semiconductor device according to claim 1, wherein an adhesiveness of the first part of the wiring pattern with resin is higher than that of the second part of the wiring pattern with the resin.

3. A semiconductor device according to claim 1, further comprising a third resin layer disposed on a second surface of the wiring substrate opposing a first surface of the wiring substrate.

4. A semiconductor device according to claim 3, wherein a material of the third resin layer is the same material as the first resin layer.

5. A semiconductor device according to claim 1, wherein the conductive member has a plurality of surfaces, a first surface of the plurality of surfaces of the conductive member being in contact with the pad, a second surface of the plurality of surfaces of the conductive member being contact with the second part of the wiring pattern, at least one surface of the plurality of surfaces of the conductive member except for the first surface of the plurality of surfaces of the conductive member and the second surface of the plurality of surfaces of the conductive member being in contact with the second resin layer.

6. A semiconductor device according to claim 5, wherein all surfaces of the plurality of surfaces except for the first surface of the plurality of surfaces and the second surface of the plurality of surfaces are in contact with the second resin layer.

7. A semiconductor device according to claim 3, further comprising:
  a second semiconductor chip mounted on the second surface of the wiring substrate and having a second pad; and
  a fourth resin layer disposed between the third resin layer and the second semiconductor chip.

8. A semiconductor device according to claim 7, wherein the material of the fourth resin layer is the same material as the second resin layer.

9. A semiconductor device according to claim 7, wherein the linear expansion coefficient of the fourth resin layer is smaller than the linear expansion coefficient of the third resin layer.

10. A semiconductor device according to claim 7, wherein the elastic modulus of the fourth resin layer is higher than the elastic modulus of the third resin layer.

11. A semiconductor device according to claim 7, wherein the third resin layer includes a second opening on the third part of the wiring pattern.

12. A semiconductor device according to claim 11, further comprising a second conductive member disposed in the second opening and connects the second pad and the third part of the wiring pattern.

13. A semiconductor device according to claim 12, wherein a part of the fourth resin layer is disposed within the second opening of the third resin layer and between the third resin layer and the second conductive member.

14. A semiconductor device according to claim 12, wherein the second conductive member has a plurality of surfaces, a first surface of the plurality of surfaces being in contact with the second pad, a second surface of the plurality of surfaces being in contact with the third part of the wiring pattern, at least one surface of the plurality of surfaces except for the first surface of the plurality of surfaces and the second surface of the plurality of surfaces being in contact with the fourth resin layer.

* * * * *